(12) United States Patent
Fei et al.

(10) Patent No.: US 10,290,795 B2
(45) Date of Patent: May 14, 2019

(54) PACKAGING METHOD AND SEMICONDUCTOR DEVICE

(71) Applicant: SHANGHAI INDUSTRIAL µTECHNOLOGY RESEARCH INSTITUTE, Shanghai (CN)

(72) Inventors: Yue Fei, Shanghai (CN); Xuhong Wang, Shanghai (CN); Ying Zhang, Shanghai (CN)

(73) Assignee: SHANGHAI INDUSTRIAL µTECHNOLOGY RESEARCH INSTITUTE, Shanghai (CN)

( * ) Notice: Subject to any disclaimer, the term of this patent is extended or adjusted under 35 U.S.C. 154(b) by 23 days.

(21) Appl. No.: 15/563,407

(22) PCT Filed: Oct. 10, 2015

(86) PCT No.: PCT/CN2015/091663
§ 371 (c)(1),
(2) Date: Sep. 29, 2017

(87) PCT Pub. No.: WO2016/086716
PCT Pub. Date: Jun. 9, 2016

(65) Prior Publication Data
US 2018/0090657 A1 Mar. 29, 2018

(30) Foreign Application Priority Data
Dec. 5, 2014 (CN) .......................... 2014 1 0737512

(51) Int. Cl.
*H01L 23/31* (2006.01)
*H01L 35/32* (2006.01)
(Continued)

(52) U.S. Cl.
CPC ................ *H01L 35/32* (2013.01); *G01J 5/12* (2013.01); *H01L 21/28273* (2013.01);
(Continued)

(58) Field of Classification Search
CPC ......... H01L 35/32; H01L 35/34; H01L 21/56; H01L 23/3114; H01L 25/50;
(Continued)

(56) References Cited

U.S. PATENT DOCUMENTS

2007/0278605 A1* 12/2007 Shibayama ............... G01J 5/10
257/432
2008/0041607 A1 2/2008 Robert
2014/0284729 A1 9/2014 Obara et al.

FOREIGN PATENT DOCUMENTS

| CN | 102616727 A | 8/2012 |
| CN | 103186693 A | 7/2013 |
| CN | 104409624 A | 3/2015 |

* cited by examiner

*Primary Examiner* — Asok K Sarkar
*Assistant Examiner* — Dmitriy Yemelyanov
(74) *Attorney, Agent, or Firm* — Novick, Kim & Lee, PLLC; Allen Xue

(57) ABSTRACT

The present disclosure provides a packaging method and a semiconductor device, the packaging method comprising: depositing a first sacrificial layer on a substrate to cover a semiconductor element formed on the substrate; covering a first dielectric layer on an upper surface and a side wall of the first sacrificial layer, the first dielectric layer has a first groove exposing part of the first sacrificial layer; covering a second sacrificial layer on surface of the exposed first sacrificial layer; covering a second dielectric layer on the second sacrificial layer and the exposed surface of the first dielectric layer, the second dielectric layer having a releasing hole exposing the second sacrificial layer and a second groove; depositing a filling layer to fill the second groove; by the releasing hole, removing the second sacrificial layer and the first sacrificial layer to form a cavity; depositing a third dielectric layer which covers the exposed surface of the second dielectric layer, and filling the releasing hole.

(Continued)

According to the present application, a step of packaging using a conduit shell is removed, thereby reducing the packaging cost of the semiconductor element and improving the yield.

10 Claims, 5 Drawing Sheets

(51) Int. Cl.
  *H01L 35/34* (2006.01)
  *G01J 5/12* (2006.01)
  *H01L 21/28* (2006.01)
  *H01L 21/56* (2006.01)
  *H01L 25/00* (2006.01)

(52) U.S. Cl.
  CPC ............ *H01L 21/56* (2013.01); *H01L 23/315* (2013.01); *H01L 23/3114* (2013.01); *H01L 25/50* (2013.01); *H01L 35/34* (2013.01); *G01J 2005/123* (2013.01)

(58) Field of Classification Search
  CPC .... H01L 21/28273; H01L 23/315; G01J 5/12; G01J 2005/123
  See application file for complete search history.

(A)

(B)

(D)

(E)

(F)

(G)

(H)

PACKAGING METHOD AND SEMICONDUCTOR DEVICE

TECHNICAL FIELD

The present application relates to a technical field of semiconductor, in particular to a packaging method and a semiconductor device.

BACKGROUND

In recent years, infrared detection technology has developed rapidly in military and civil fields, and various infrared detectors have also become increasing demands in the market. Thermopile infrared detectors, which have characteristics such as low cost, simple manufacturing process, no need of addition of bias voltage and no 1/f noise, and etc., are widely used in various infrared detection systems.

A thermopile infrared detector utilizes Seebeck effect, with hot junction and cold junction designed on the surface of a semiconductor substrate. There is an infrared absorption layer in the hot junction area, responsible for absorbing infrared radiation (generally in a wavelength range of 8-14 um) of an object that needs to be detected. The infrared absorption layer generates heat due to absorption of infrared radiation and conducts the heat to the hot junctions, with a temperature difference generated between the hot junctions and the cold junctions. The cold junctions are on the semiconductor substrate and has the same temperature as ambient temperature. By means of the Seebeck effect, an electric potential difference is generated between two electrodes of the thermopile infrared detector that are connected to the hot junctions and the cold junctions respectively. By detecting the electric potential difference, size of the infrared radiation of the object to be detected can be detected, and then surface temperature of the object to be detected can be given by combining parameters such as emissivity of the object to be detected, an optical system, a thermal conversion efficiency, and the like.

Generally, the thermopile infrared detector needs to be packaged in vacuum or in low-pressure gas after it has been manufactured, to reduce thermo-convective interference caused by air to the infrared absorption layer of the detector and improve sensitivity and stability of the detector. A traditional infrared detector is packaged mostly by a TO (Transistor Outline) can, FIG. 1 is a schematic diagram of a device of the packaged thermopile detector, in which FIG. 1 (A) is a bottom view, and FIG. 1 (B) is a side view. In the traditional TO package form, the infrared detector is placed and secured at the bottom of the TO tube, with a TO can having an infrared filter sealed on the top thereof, the infrared filter is responsible for filtering various needless optical wavelength. The TO can is vacuumized inside or is filled with the low-pressure gas, with several pins that are connected to the electrodes of the infrared detector being elicited at the bottom of the TO tube for the use of testing.

It should be noted that, the above introduction to the background is merely for the convenience of clear and complete description of the technical solution of the present application, and for the convenience of understanding of persons skilled in the art. It cannot be regarded that the above technical solution is commonly known to persons skilled in the art just because that the solution has been set forth in the background of the present application.

SUMMARY

The inventor of the present application has found that, when the thermopile infrared detector is packaged by the packaging method of using the TO packaging, it is necessary to equip each thermopile infrared detector with a TO can, accordingly, the cost is increased significantly during mass production process.

The present application provides a packaging method and a semiconductor device, which uses the semiconductor micro-fabrication technology to fabricate a packaging shell of an integrated filter directly on each thermopile infrared detector unit, avoids the steps of packaging of the thermopile infrared detectors one by one by using TO packaging, thereby greatly reducing the packaging cost and improving the yield at the same time.

According to one aspect of an embodiment of the present application, there is provided with a packaging method, which includes:

depositing a first sacrificial layer 4 on a substrate 1 to cover a semiconductor element 3 formed on the substrate 1, and an area of the sacrificial layer 4 is larger than that of the semiconductor element 3;

covering a first dielectric layer 5 on an upper surface and a side wall of the first sacrificial layer 4, the first dielectric layer 5 has a first groove exposing part of the first sacrificial layer 4, the first groove is above the semiconductor element 3, and an area of the first groove is larger than that of the semiconductor element 3;

covering a second sacrificial layer 6 on surface of the exposed first sacrificial layer 4, and part of the first dielectric layer 5 on the upper surface of the first sacrificial layer is also covered by the second sacrificial layer 6;

covering a second dielectric layer 7 on the second sacrificial layer 6 and the exposed surface of the first dielectric layer 5, the second dielectric layer having a releasing hole exposing the second sacrificial layer 6 and a second groove, the second groove is above the first groove;

depositing a filling layer 9 to fill the second groove;

by the releasing hole 8, removing the second sacrificial layer and the first sacrificial layer to form a cavity enclosed by the substrate, the first dielectric layer 5, the second dielectric layer 7 and the filling layer 9, the cavity being in communication with the outside by the releasing hole 8;

depositing a third dielectric layer 10 which covers the exposed surface of the second dielectric layer 7, and filling the releasing hole 8 to seal the releasing hole 8.

According to another aspect of the embodiment of the present application, the first substrate further has an electrode 2 that is electrically connected to the semiconductor element, the electrode and the semiconductor element are on the same side of the substrate, and the method further includes:

removing the first dielectric layer, the second dielectric layer and/or the third dielectric layer covered on the electrode 2.

According to another aspect of the embodiment of the present application, the third dielectric layer 10 is connected to the first dielectric layer by the releasing hole.

According to another aspect of the embodiment of the present application, the material of the first sacrificial layer and the second sacrificial layer is polyimide, amorphous silicon, polycrystalline silicon, silicon oxide or photoresist respectively, and the first sacrificial layer and the second sacrificial layer are made of the same material; the material of the first dielectric layer, the second dielectric layer and the third dielectric layer is silicon nitride, silicon oxide, amorphous silicon or polycrystalline silicon respectively, and the first dielectric layer, the second dielectric layer and the third dielectric layer are made of the same or different materials.

According to another aspect of the embodiment of the present application, the semiconductor element 3 has a thermopile detector structure and a thermopile detector absorption layer; the filling layer 9 consists of a filter film to filter light wave irradiated to the cavity via the filling layer 9.

According to another aspect of the embodiment of the present application, a semiconductor device is provided, including: a substrate 1; a semiconductor element 3 on surface of the substrate; a first dielectric layer 5, a second dielectric layer 7 and a third dielectric layer 10 that are on the surface of the substrate and are stacked sequentially from bottom to top; and a filling material 9; the first dielectric layer, the second dielectric layer and the third dielectric layer each has a penetrating groove that is above the semiconductor element 3, and the filling material 9 fills the grooves of the second dielectric layer 7 and the third dielectric layer 10; the substrate, the first dielectric layer 5, the second dielectric layer 7, the third dielectric layer 10 and the filling layer 9 enclose a closed cavity, the semiconductor element 3 is accommodated in the cavity; and a portion of the second dielectric layer 7 that constitutes an upper wall of the cavity has a releasing hole, the third dielectric layer 10 fills the releasing hole, and the third dielectric layer 10 is connected to the first dielectric layer 5 by the releasing hole.

According to another aspect of the embodiment of the present application, the semiconductor device further has an electrode 2 that is electrically connected to the semiconductor element, the electrode and the semiconductor element are on the same side of the substrate.

According to another aspect of the embodiment of the present application, the material of the first dielectric layer, the second dielectric layer and the third dielectric layer is silicon nitride, silicon oxide, amorphous silicon or polycrystalline silicon respectively, and the first dielectric layer, the second dielectric layer and the third dielectric layer are made of the same or different materials.

According to another aspect of the embodiment of the present application, the semiconductor element 3 has a thermopile detector structure and a thermopile detector absorption layer; the filling layer 9 consists of a filter film to filter light wave irradiated to the cavity via the filling layer 9.

The present application has beneficial effects that: the filling layer 9 serving as for example a filter is integrated directly on the packaging shell of each semiconductor element serving as for example a thermopile infrared detector unit, thereby realizing package of a wafer level, which can thus greatly reduce packaging cost and improve production efficiency of the semiconductor device, as compared with packaging the semiconductor elements one by one.

With reference to the Description and drawings below, a specific embodiment of the present application is disclosed in detail, which specifies the manner in which the principle of the present application can be adopted. It should be understood that, the scope of the embodiment of the present application is not limited. Within the scope of the spirit and clause of the appended claims, the embodiment of the present application includes many variations, modifications and equivalents.

The features described and/or shown for one embodiment can be used in one or more other embodiments in the same or similar manner, can be combined with the features in other embodiments or replace the features in other embodiments.

It should be emphasized that, the term "include/comprise/contain" refers to, when being used in the text, existence of features, parts, steps or assemblies, without exclusion of existence or attachment of one or more other features, parts, steps or assemblies.

BRIEF DESCRIPTION OF THE DRAWINGS

The included drawings are used for providing further understanding on the embodiment of the present application, constitute a portion of the Description, are used for illustrating the embodiment of the present application and explain the principle of the present application together with the literary description. Obviously, the drawings described below are merely some examples of the present application, persons ordinarily skilled in the art can also obtain other drawings according to these drawings without making creative efforts. In the drawings.

DETAILED DESCRIPTION

With reference to the drawings, the foregoing and other features of the present application will become apparent through the following description. The Description and drawings specifically disclose the particular embodiment of the present application, showing part of the embodiment in which the principle of the present application can be adopted, it should be understood that the present application is not limited to the described embodiment, on the contrary, the present application includes all modifications, variations and equivalents that fall within the scope of the appended claims.

In the present application, for the convenience of description, a surface of the substrate on which a semiconductor element is disposed is called "an upper surface", a surface of the substrate that is opposite to the "an upper surface" is called "a lower surface", thereby, "upper" direction refers to a direction pointed from "a lower surface" to "an upper surface", and a "lower" direction is opposite to the "upper" direction. In the present application, "upper" and "lower" are set relatively, which are merely for the convenience of description, but do not represent orientations when the packaging method is specifically implemented or the semiconductor device is used.

The Embodiment 1

The embodiment 1 of the present application provides a packaging method for packaging a semiconductor element.

Figure 1:
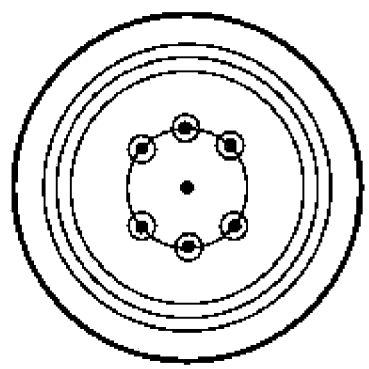
FIG. 1 is a structural schematic diagram of the device of the infrared detector that is packaged by a TO can in the prior art.
Figure 1:
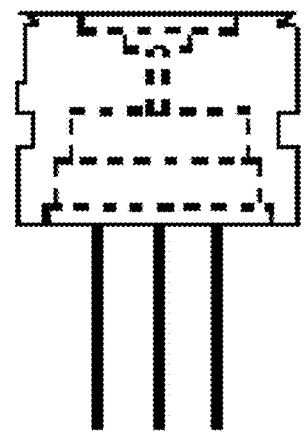
Figure 2:
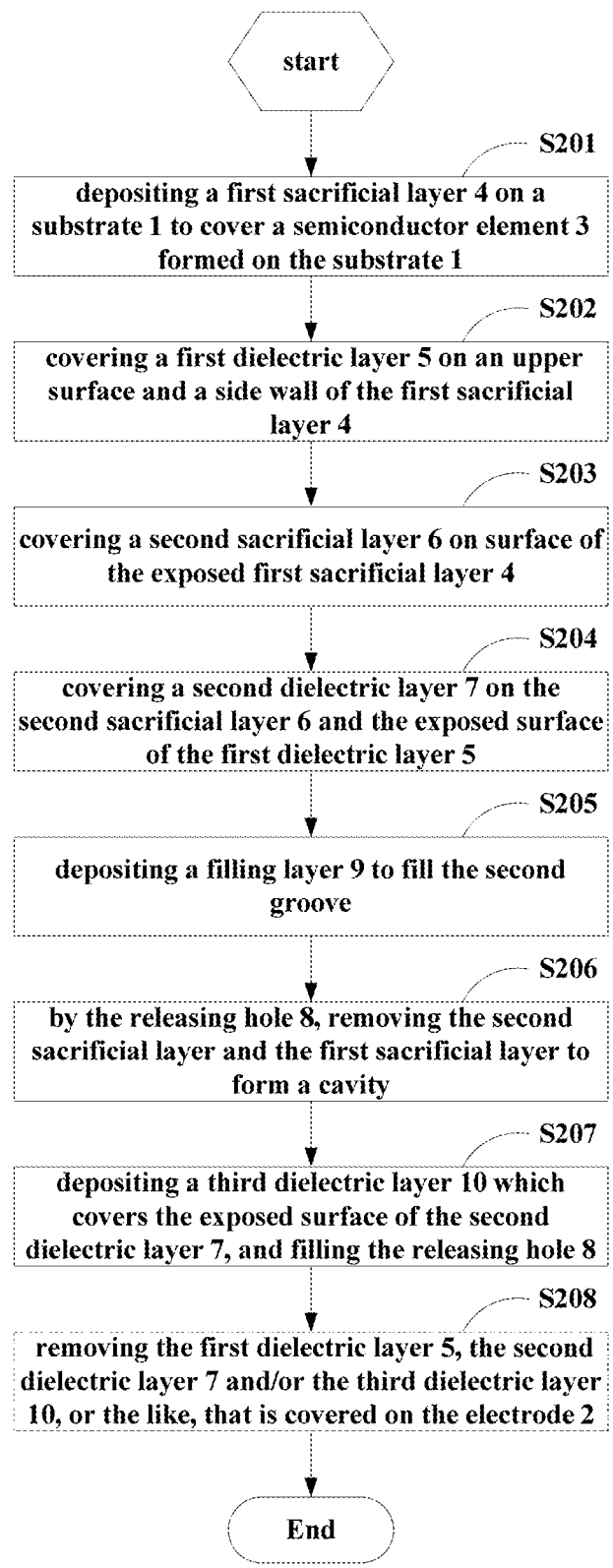
FIG. 2 is a flow schematic diagram of the packaging method of the embodiment of the present application.
Figure 3:
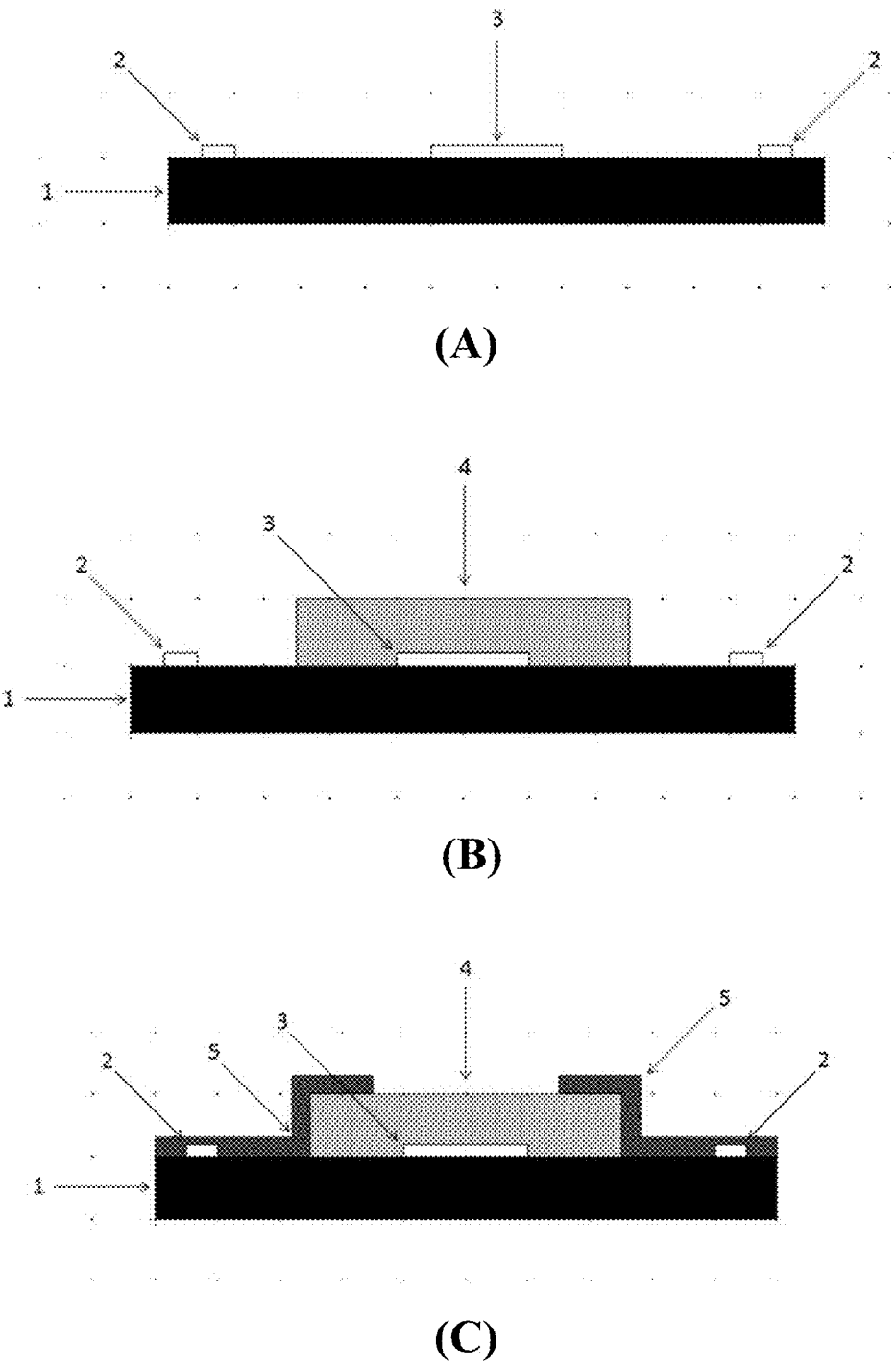
FIGS. 3 (A)-3 (H) are structural schematic diagrams of the device corresponding to each step of the packaging method of the embodiment of the present application.
Figure 3:
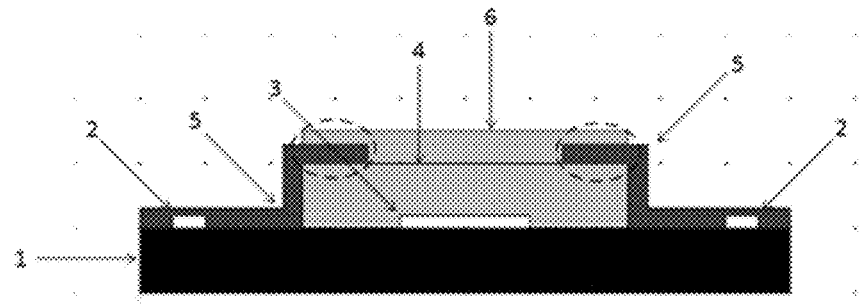
Figure 3:
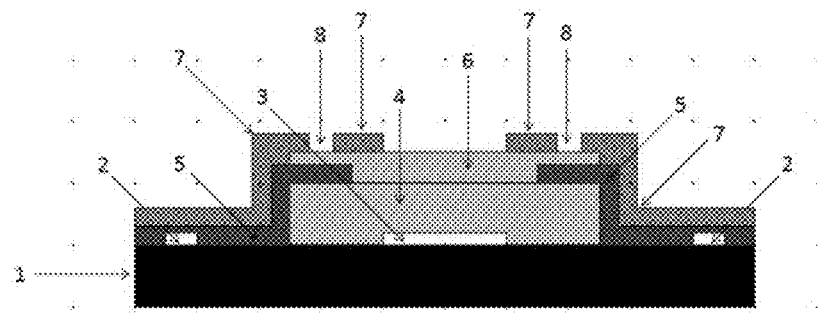
Figure 3:
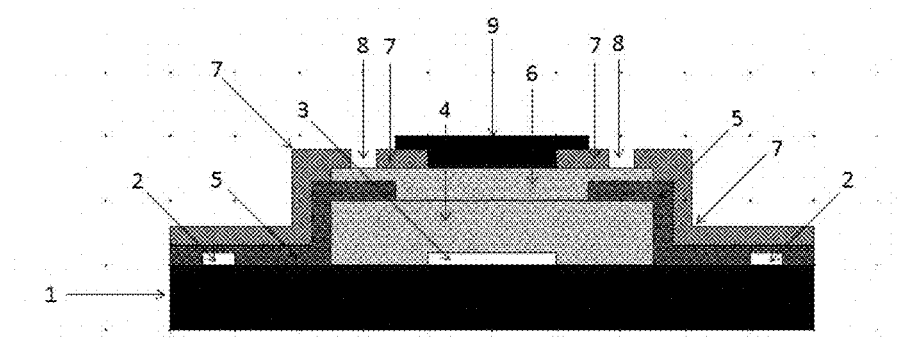
Figure 3:
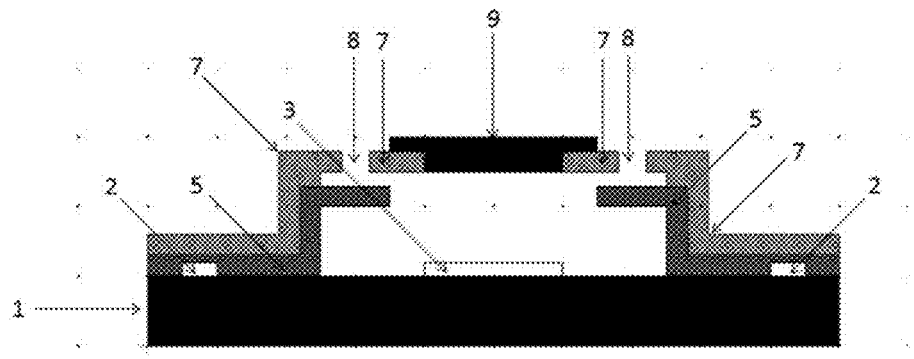
Figure 3:
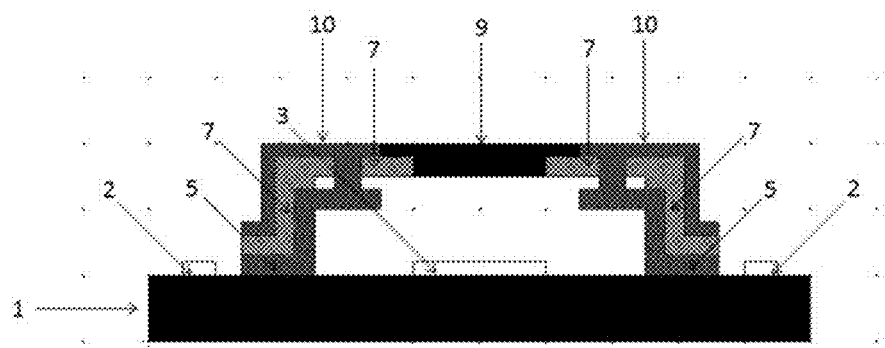

FIG. 2 is a flow schematic diagram of the packaging method in the embodiment of the present application, FIG. 3 is a structural schematic diagram of the device corresponding to each step of the packaging method in the embodiment of the present application. As shown in FIG. 2, the packaging method includes steps S201-S207. Hereinafter the packaging method of the embodiment is described in conjunction with FIG. 2 and FIG. 3.

The step S201: depositing a first sacrificial layer 4 on a substrate 1 to cover a semiconductor element 3 formed on the substrate 1.

In the embodiment, the substrate may be a wafer commonly used in the semiconductor manufacturing field, such as a silicon wafer, an SOI (Silicon-On-Insulator) wafer, a Germanium silicon wafer, a Germanium wafer or a Gallium nitride wafer, or the like, but the embodiment is not limited thereto.

In the embodiment, as shown in FIG. 3 (A), before the step S201, the semiconductor element 3 may be formed on the upper surface of the substrate 1, the semiconductor element 3 may have for example an infrared thermopile detector structure and an infrared thermopile detector absorption layer, specific structure and the form of formation of the infrared thermopile detector structure and the infrared thermopile detector absorption layer can be reflected in the related art and thus will not be repeated in the embodiment. In addition, in the embodiment, the semiconductor element 3 may also be other types of semiconductor elements, there is no limitation in the embodiment, such as a pyroelectric detector structure, a ultraviolet photodetector structure, a light emitting diode structure and/or a laser structure, and the like.

In the step S201, a first sacrificial thin film is coated on the substrate 1 on the upper surface of which the semiconductor element 3 is formed, and the first sacrificial thin film is patterned by mask template photoetching and etching and other related processes, to form a first sacrificial layer 4. As shown in FIG. 3 (B), after the step S201, an area of the upper surface of the first sacrificial layer 4 may be larger than that of the upper surface of the semiconductor element 3, thereby a cavity formed later has a large volume, facilitating the semiconductor element 3 to work, for example, when the semiconductor element 3 has an infrared thermopile detector structure and an infrared thermopile detector absorption layer, a larger cavity volume may be more convenient for the semiconductor element 3 to absorb light wave.

The step S202: covering a first dielectric layer 5 on an upper surface and a side wall of the first sacrificial layer 4, the first dielectric layer 5 has a first groove exposing part of the first sacrificial layer 4, the first groove is above the semiconductor element 3, and an area of the first groove is larger than that of the semiconductor element 3.

In the step S202 in the embodiment, a first dielectric thin film may be firstly deposited on the already formed first sacrificial layer 4, such that the first dielectric thin film covers the upper surface and the side wall of the whole first sacrificial layer 4; then the first dielectric thin film is patterned by mask template photoetching and etching and other related processes, to form a first dielectric layer 5. As shown in FIG. 3 (C), the first dielectric layer 5 formed in the step S202 has a first groove exposing part of the upper surface of the first sacrificial layer 4, the first groove is above the semiconductor element 3, and an area of the first groove is larger than that of the semiconductor element 3, thereby the semiconductor element 3 is convenient for receiving the light wave from the outside, and the like.

The step S203: covering a second sacrificial layer 6 on surface of the exposed first sacrificial layer 4, and part of the first dielectric layer 5 on the upper surface of the first sacrificial layer is also covered by the second sacrificial layer 6.

In the step S203 of the embodiment, a second sacrificial thin film is coated on the substrate, then the second sacrificial thin film is patterned by mask template photoetching and etching and other related processes, to form a second sacrificial layer 6. As shown in FIG. 3 (D), the second sacrificial layer 6 formed in the step S203 is connected to the first sacrificial layer 4 and covers part of the first dielectric layer 5 on the upper surface of the first sacrificial layer 4, the part of the first dielectric layer 5 may for example be shown as the virtual line in FIG. 3 (D).

The step S204: covering a second dielectric layer 7 on the second sacrificial layer 6 and the exposed surface of the first dielectric layer 5, the second dielectric layer having a releasing hole exposing the second sacrificial layer 6 and a second groove, and the second groove is above the first groove.

In the step S204 of the embodiment, a second dielectric thin film is firstly deposited on the substrate to cover the whole second sacrificial layer 6, and also part of the second dielectric thin film is connected to the first dielectric layer 5; then the second dielectric thin film is patterned by mask template photoetching and etching and other related processes, to form a second dielectric layer 7. As shown in FIG. 3 (E), the second dielectric layer 7 formed in the step S204 covers the second sacrificial layer 6 and the exposed surface of the first dielectric layer 5, and the top of the second dielectric layer 7 has a releasing hole 8 exposing the second sacrificial layer 6 and a second groove. In addition, in the embodiment, in the case that the semiconductor element 3 has an infrared thermopile detector structure and an infrared thermopile detector absorption layer, size of the second groove may be not less than size of the infrared thermopile detector absorption layer, thereby being convenient for the absorption layer to absorb the light wave.

The step S205: depositing a filling layer 9 to fill the second groove.

In the step S205 of the embodiment, a filling thin film may be deposited, then the filling thin film is patterned by mask template photoetching and etching and other related processes, to form a filling layer 9. As shown in FIG. 3 (F), the filling layer 9 formed in the step S205 fills the second groove of the second sacrificial layer 6.

In the embodiment, the filling layer 9 may consist of for example a filter thin film for filtering the light wave. The filter thin film may be formed for example by stacking thin films of different material.

The step S206: by the releasing hole 8, removing the second sacrificial layer and the first sacrificial layer to form a cavity enclosed by the substrate, the first dielectric layer 5, the second dielectric layer 7 and the filling layer 9, the cavity being in communication with the outside by the releasing hole 8.

In the step S206 of the embodiment, the second sacrificial layer and the first sacrificial layer can be removed gradually via the releasing hole by the method such as microwave or radio frequency oxygen plasma ashing, to form the cavity, as shown in FIG. 3 (G).

The step S207: depositing a third dielectric layer 10 which covers the exposed surface of the second dielectric layer 7, and filling the releasing hole 8 to seal the releasing hole 8.

In the step S207 of the embodiment, a third dielectric thin film may be deposited in vacuum or in low-pressure atmosphere, then the third dielectric thin film is patterned by mask template photoetching and etching and other related processes, to form a third dielectric layer 10. As shown in FIG. 3 (H), the third dielectric layer 10 formed in the step S207 covers the exposed portion of the second dielectric layer 7 to expose the filling layer 9; and part of the third dielectric layer 10 is deposited to enter the releasing hole and seal the releasing hole, thereby forming a vacuum or low-pressure environment in the cavity. In addition, the third dielectric layer 10 may also be connected to the first dielectric layer 5 via the releasing hole 8, thus the strength of the connected first dielectric layer 5 and the third dielectric layer 10 is improved.

In addition, in the embodiment, as shown in FIG. 3 (A)-FIG. 3 (H), the first substrate may also have an electrode 2 electrically connected to the semiconductor element 3, the electrode and the semiconductor element are on the same side of the substrate, namely an upper surface of the substrate 1, in this case, during the process of the steps S201 to S207, it is possible to cover at least one of the first dielectric layer 5, the second dielectric layer 7 and the third dielectric layer 10 on surface of the electrode 2, in this case, after the step S207, the packaging method may further include the following step S208 (not shown):

removing the first dielectric layer 5, the second dielectric layer 7 and/or the third dielectric layer 10, or the like, that is covered on the electrode 2, to expose the electrode 2.

In addition, in other embodiments, the electrode 2 may also on the back of the substrate 1, in this case, during the process of the steps S201 to S207, the electrode 2 is not covered by any thin film, then the step S208 may be not necessary.

In addition, the packaging method may further have a cutting step in which the substrate 1 can be cut to form separate packaging structures, each of the packaging structures may have a semiconductor element to form an independent semiconductor device and may also have a plurality of semiconductor elements so as to form an array of semiconductor devices.

In the embodiment, the material of the first sacrificial layer and the second sacrificial layer may be polyimide, amorphous silicon, polycrystalline silicon, silicon oxide or photoresist or the like respectively, which belongs to a sacrificial layer commonly seen in semiconductor manufacturing field, and the first sacrificial layer and the second sacrificial layer may be made of the same material, thereby in the process of forming the first sacrificial layer and the second sacrificial layer and removing the first sacrificial layer and the second sacrificial layer, the process can be simplified. In the embodiment, the material of the first dielectric layer, the second dielectric layer and the third dielectric layer may be silicon nitride, silicon oxide, amorphous silicon or polycrystalline silicon or the like, which belongs to a nonconductive dielectric film commonly used in the semiconductor manufacturing field, and the first dielectric layer, the second dielectric layer and the third dielectric layer may be made of the same or different materials. For example, the first sacrificial layer 4 and the second sacrificial layer 6 may both be made of polyimide, the first dielectric layer 5, the second dielectric layer 7 and the third dielectric layer 10 may all be made of silicon nitride.

According to the above embodiment of the present application, the filling layer 9 serving as for example a filter is integrated directly on the packaging shell of each semiconductor element serving as for example a thermopile infrared detector unit, thereby realizing package of a wafer level, which can thus greatly reduce packaging cost and improve production efficiency of the semiconductor device, as compared with packaging the semiconductor elements one by one.

Hereinafter, a specific embodiment of the packaging method of the application is described in detail in conjunction with a specific example and FIG. 3.

In the embodiment, the material of both of the first sacrificial layer and the second sacrificial layer is polyimide (PI), the material of the first dielectric layer through the third dielectric layer is silicon nitride ($Si_3N_4$); and the infrared thermopile detector absorption layer and the infrared thermopile detector structure 3, and the electrode 2 electrically connected thereto are manufactured in advance on the substrate 1, and the electrode 2 and the semiconductor element 3 are both on the upper surface of the substrate, as shown in FIG. 3 (A); and the substrate 1 may be a silicon wafer.

The embodiment comprises the following steps:

1) coating a first layer of polyimide (PI) thin film by methods of adhesive-dripping, whirl coating and baking on front of the substrate 1 having the infrared thermopile detector absorption layer and the infrared thermopile detector structure 3, as a first sacrificial thin film for wafer-level packaging.

2) photoetching the first sacrificial thin film by mask template, and using ICP etching to form a first sacrificial layer 4 which covers the infrared thermopile detector absorption layer and the infrared thermopile detector structure 3, as shown in FIG. 3 (B).

3) depositing a first dielectric thin film, silicon nitride ($Si_3N_4$), by the LPCVD or PECVD method, on the basis of the already formed first sacrificial layer 4, such that the first dielectric thin film covers the entire first sacrificial layer 4.

4) photoetching the first dielectric thin film by the mask template photoetching process, etching the photo-etched first dielectric thin film by RIE or ICP to form a first dielectric layer 5; the first dielectric layer 5 covers an electrode 2, and exposing a groove pattern on top of the first dielectric layer 5, dimensional width of which is larger than size of the infrared thermopile detector absorption layer, as shown in FIG. 3 (C).

5) spin-coating a layer of polyimide (PI) thin film, as a second sacrificial thin film.

6) photoetching the second sacrificial thin film by mask template, and etching the second sacrificial thin film by ICP to form a second sacrificial layer 6 which covers a groove portion of the first dielectric layer 5 and is connected to the first sacrificial layer 4, as shown in FIG. 3 (D).

7) depositing a second dielectric layer thin film, silicon nitride ($Si_3N_4$), by LPCVD or PECVD, such as the second dielectric layer thin film covers the entire second sacrificial layer 6, and part of the second dielectric layer thin film is connected to the first dielectric layer 5.

8) forming a second dielectric layer pattern by mask template photoetching, etching the pattern by RIE or ICP to form a second dielectric layer 7; there is a groove pattern on top of the second dielectric layer 7, as a window of the filter, dimensional width of the groove pattern is not smaller than size of the infrared thermopile detector absorption layer; besides, further exposing two concave holes on top of the second dielectric layer 7, as releasing holes 8 for releasing a sacrificial layer structure, as shown in FIG. 3 (E).

9) depositing a layer of an infrared filter thin film by LPCVD or PECVD, the filter thin film can be formed by stacking thin films of different materials, and a film system is designed as filter wavelength required by the infrared thermopile detector.

10) forming a filling layer pattern by mask template photoetching, and etching the pattern by RIE or ICP to form a filling layer 9 which is used as an infrared filter, as shown in FIG. 3 (F).

11) by the method such as microwave or radio frequency oxygen plasma ashing, gradually releasing the sacrificial layers, the polyimide (PI) thin films, namely the second sacrificial layer 6 and the first sacrificial layer 4, via the releasing holes 8, to form a cavity, as shown in FIG. 3 (G).

12) in vacuum or in low-pressure atmosphere, continuing to deposit a third dielectric layer thin film, silicon nitride ($Si_3N_4$), by LPCVD or PECVD, such that the third dielectric layer thin film covers surface of the entire second dielectric layer 7, part of the third dielectric layer thin film is deposited to enter the releasing hole 8 and is connected to the first dielectric layer 5 and the second dielectric layer 7 and to seal the releasing hole 8, thereby forming a vacuum or low-pressure environment in the cavity.

13) forming a third dielectric layer pattern by mask template photoetching, etching the pattern by RIE or ICP to form a third dielectric layer 10. The third dielectric layer has a region exposed on top, the region exposing the filling layer 9; in addition, three dielectric layers 5, 7 and 10 covered on the surface of the electrode 2 are etched to expose the covered electrode 2; thereby forming a thermopile infrared detector unit including an infrared filter on the surface of the silicon wafer substrate 1, as shown in FIG. 3 (H).

14) cutting and separating the thermopile infrared detector unit on the silicon wafer substrate 1, finishing manufacture of the package structure to form a semiconductor device.

In the above specific embodiment, the filter is integrated directly on the packaging shell of each thermopile infrared detector unit by a wafer-level packaging method, achieving to save an expensive step of one-by-one TO conduit shell packaging of the thermopile infrared detector, greatly reducing the packaging cost of the thermopile infrared detector, and improving production efficiency of the thermopile infrared detector during production.

It is necessary to explain that, the above specific embodiment corresponding to FIG. 3 is described by taking packaging to form a thermopile infrared detector unit as an example, but the embodiment is not limited to this, the packaging method in the embodiment may also be used for packaging other type of semiconductor element 3 that needs to be packaged within the cavity to form corresponding semiconductor device, for example, the semiconductor element 3 may also be a pyroelectric detector structure, a ultraviolet photodetector structure, a light emitting diode structure and/or a laser structure, and the like, and type of material of the filling layer 9 or air pressure value within the packaged cavity can vary depending on different types of the semiconductor element 3, but the embodiment is not limited to this, for example, when the semiconductor element 3 is other type of optical detector, the material of the filling layer 9 can be selected such that light wave detected by the semiconductor element 3 can transmit and light of other wavelengths is filtered.

The Embodiment 2

The embodiment 2 of the present application provides a semiconductor device obtained by the packaging method in the embodiment 1.

As shown in FIG. 3 (H), the semiconductor device includes: a substrate 1; a semiconductor element 3 on surface of the substrate; a first dielectric layer 5, a second dielectric layer 7 and a third dielectric layer 10 that are on the surface of the substrate and are stacked sequentially from bottom to top; and a filling layer 9.

The first dielectric layer, the second dielectric layer and the third dielectric layer each has a penetrating groove that is above the semiconductor element 3, and the filling material 9 fills the grooves of the second dielectric layer 7 and the third dielectric layer 10; the substrate, the first dielectric layer 5, the second dielectric layer 7, the third dielectric layer 10 and the filling layer 9 enclose a closed cavity, the semiconductor element 3 is accommodated in the cavity; and a portion of the second dielectric layer 7 that constitutes an upper wall of the cavity has a releasing hole, the third dielectric layer 10 fills the releasing hole, and the third dielectric layer 10 is connected to the first dielectric layer 5 by the releasing hole.

Specific description of parts of the semiconductor device in embodiment 2 can be found in embodiment 1, and thus will not be repeated in this embodiment.

According to the embodiment of the present application, a semiconductor device having a compact structure can be formed, which reduces manufacturing cost of the semiconductor device and improves performance of the semiconductor device.

The present application is described in combination with specific embodiments hereinabove, but a person skilled in the art should know clearly that the description is exemplary, but not limitation to the protection scope of the present application. A person skilled in the art can make various variations and modifications to the present application according to spirit and principle of the application, and these variations and modifications should also be within the scope of the present application.

What is claimed is:

1. A packaging method, comprising:
   depositing a first sacrificial layer on a substrate to cover a semiconductor element formed on the substrate, wherein an area of the sacrificial layer is larger than that of the semiconductor element;
   forming a first dielectric layer on a portion of an upper surface and a side wall of the first sacrificial layer so as to form a first groove exposing part of the first sacrificial layer, the first groove is aligned with the semiconductor element in a vertical direction that is perpendicular to the substrate, and an area of the first groove is larger than that of the semiconductor element;
   forming a second sacrificial layer on a surface of the exposed first sacrificial layer in the first groove, and a portion of the first dielectric layer;
   forming second dielectric layer on the second sacrificial layer and the exposed surface of the first dielectric layer, wherein the second dielectric layer has a releasing hole exposing the second sacrificial layer and a second groove exposing the second sacrificial layer in first groove;
   depositing a filling layer to fill the second groove;
   removing the second sacrificial layer and the first sacrificial layer via the releasing hole to form a cavity, wherein the cavity is enclosed by the substrate, the first dielectric layer, the second dielectric layer and the filling layer, the cavity being in communication with the outside by the releasing hole;
   forming a third dielectric layer on an exposed surface of the second dielectric layer and inside the releasing hole to seal the releasing hole,
   wherein the cavity is enclosed by the substrate, the first dielectric layer, the second dielectric layer, the filling layer, and the sealed releasing hole, and
   wherein the filling layer is aligned with the semiconductor element in the vertical direction and the filling layer filters light irradiating into the cavity through the filling layer on the semiconductor element.

2. The packaging method according to claim 1, wherein the first substrate further comprises an electrode that is electrically connected to the semiconductor element, the electrode and the semiconductor element are disposed on a same side of the substrate.

3. The packaging method according to claim 1, wherein the releasing hole connects the third dielectric layer and the first dielectric layer.

4. The packaging method according to claim 1, wherein the first sacrificial layer and the second sacrificial layer are made of the same material chosen from polyimide, amorphous silicon, polycrystalline silicon, silicon oxide, or photoresist.

5. The packaging method according to claim 1, wherein the semiconductor element comprises a thermopile detector structure and a thermopile detector absorption layer, and
the filling layer comprises a filter film that filters light irradiating into the cavity through the filling layer.

6. A semiconductor device, comprising:
a substrate;
a semiconductor element on surface of the substrate;
a first dielectric layer, a second dielectric layer and a third dielectric layer that are on the surface of the substrate and are stacked sequentially from bottom to top; and
a filling layer;
wherein the first dielectric layer, the second dielectric layer and the third dielectric layer each has an opening vertically aligned with the semiconductor element, and the filling material fills the openings in the second dielectric layer and the third dielectric layer;
the substrate, the first dielectric layer, the second dielectric layer, the third dielectric layer and the filling layer forms a cavity that is hermetically sealed, the semiconductor element resides in the cavity;
and a portion of the second dielectric layer that constitutes an upper wall of the cavity has a releasing hole filled by the third dielectric layer, and the releasing hole extend to the third dielectric layer,
wherein the filling layer is aligned with the semiconductor element in the vertical direction perpendicular to the substrate and the filling layer filters light irradiating through the filling layer on the semiconductor element.

7. The semiconductor device according to claim 6, wherein the semiconductor device further has an electrode that is electrically connected to the semiconductor element, the electrode and the semiconductor element are disposed on a same side of the substrate.

8. The semiconductor device according to claim 6, wherein the first dielectric layer, the second dielectric layer, and the third dielectric layer are made of a same material or different materials independently chosen from silicone nitride, silicone oxide, amorphous silicone, or polycrystalline silicone.

9. The semiconductor device according to claim 6, wherein the semiconductor element comprises a thermopile detector structure and a thermopile detector absorption layer, and
the filling layer comprises a filter film that filters light irradiating into the cavity through the filling layer.

10. The packaging method according to claim 1, wherein the first dielectric layer, the second dielectric layer, and the third dielectric layer are made of a same material or different materials independently chosen from silicone nitride, silicone oxide, amorphous silicone or polycrystalline silicone.

* * * * *